(12) United States Patent
White et al.

(10) Patent No.: US 11,411,159 B1
(45) Date of Patent: Aug. 9, 2022

(54) INTEGRATED READOUT CARD

(71) Applicant: Google LLC, Mountain View, CA (US)

(72) Inventors: Theodore Charles White, Santa Barbara, CA (US); John Martinis, Santa Barbara, CA (US)

(73) Assignee: Google LLC, Mountain View, CA (US)

( * ) Notice: Subject to any disclaimer, the term of this patent is extended or adjusted under 35 U.S.C. 154(b) by 46 days.

(21) Appl. No.: 17/104,826

(22) Filed: Nov. 25, 2020

Related U.S. Application Data

(60) Provisional application No. 62/941,230, filed on Nov. 27, 2019.

(51) Int. Cl.
| | |
|---|---|
| *H05K 1/02* | (2006.01) |
| *H01L 39/02* | (2006.01) |
| *H01L 39/04* | (2006.01) |
| *H03F 19/00* | (2006.01) |
| *H01P 1/383* | (2006.01) |
| *H01L 39/22* | (2006.01) |
| *G06N 10/00* | (2022.01) |
| *H01P 5/18* | (2006.01) |
| *B82Y 10/00* | (2011.01) |

(52) U.S. Cl.
CPC .......... *H01L 39/045* (2013.01); *G06N 10/00* (2019.01); *H01L 39/025* (2013.01); *H01L 39/223* (2013.01); *H01P 1/383* (2013.01); *H01P 5/184* (2013.01); *H03F 19/00* (2013.01); *H05K 1/0209* (2013.01); *H05K 1/0233* (2013.01); *B82Y 10/00* (2013.01); *H05K 2201/10022* (2013.01); *H05K 2201/10045* (2013.01); *H05K 2201/10068* (2013.01)

(58) Field of Classification Search
CPC ................ H01L 39/045; H01L 39/025; H01L 39/223; G06N 10/00; H01P 1/383; H01P 5/184; H03F 19/00; H05K 1/0209; H05K 1/0233; H05K 2201/10022; H05K 2201/10045; H05K 2201/10068; B82Y 10/00

See application file for complete search history.

(56) References Cited

U.S. PATENT DOCUMENTS

| | | | |
|---|---|---|---|
| 9,589,236 B1* | 3/2017 | Abdo | H01L 27/14629 |
| 11,127,893 B2* | 9/2021 | Johnson | G06N 10/00 |
| 2003/0207766 A1* | 11/2003 | Esteve | G11C 16/02 |
| | | | 505/190 |
| 2017/0092833 A1* | 3/2017 | Abdo | H04Q 9/00 |
| 2018/0003753 A1* | 1/2018 | Bishop | G06N 20/00 |
| 2019/0229690 A1* | 7/2019 | White | H03F 19/00 |
| 2020/0036330 A1* | 1/2020 | Abdo | H01F 6/06 |
| 2020/0052183 A1* | 2/2020 | Shainline | G06N 3/088 |

* cited by examiner

*Primary Examiner* — Hoa C Nguyen
(74) *Attorney, Agent, or Firm* — Fish & Richardson P.C.

(57) ABSTRACT

An integrated qubit readout circuit is presented, which includes a superconducting parametric amplifier, a circuit board arranged to mount the superconducting parametric amplifier, a circulator mounted on the circuit board and connected to the superconducting parametric amplifier, wherein the circulator comprises a termination port electrically connected to a termination resistor arranged to terminate a pump tone received by the superconducting parametric amplifier, and wherein the termination resistor is mounted on the circuit board.

18 Claims, 8 Drawing Sheets

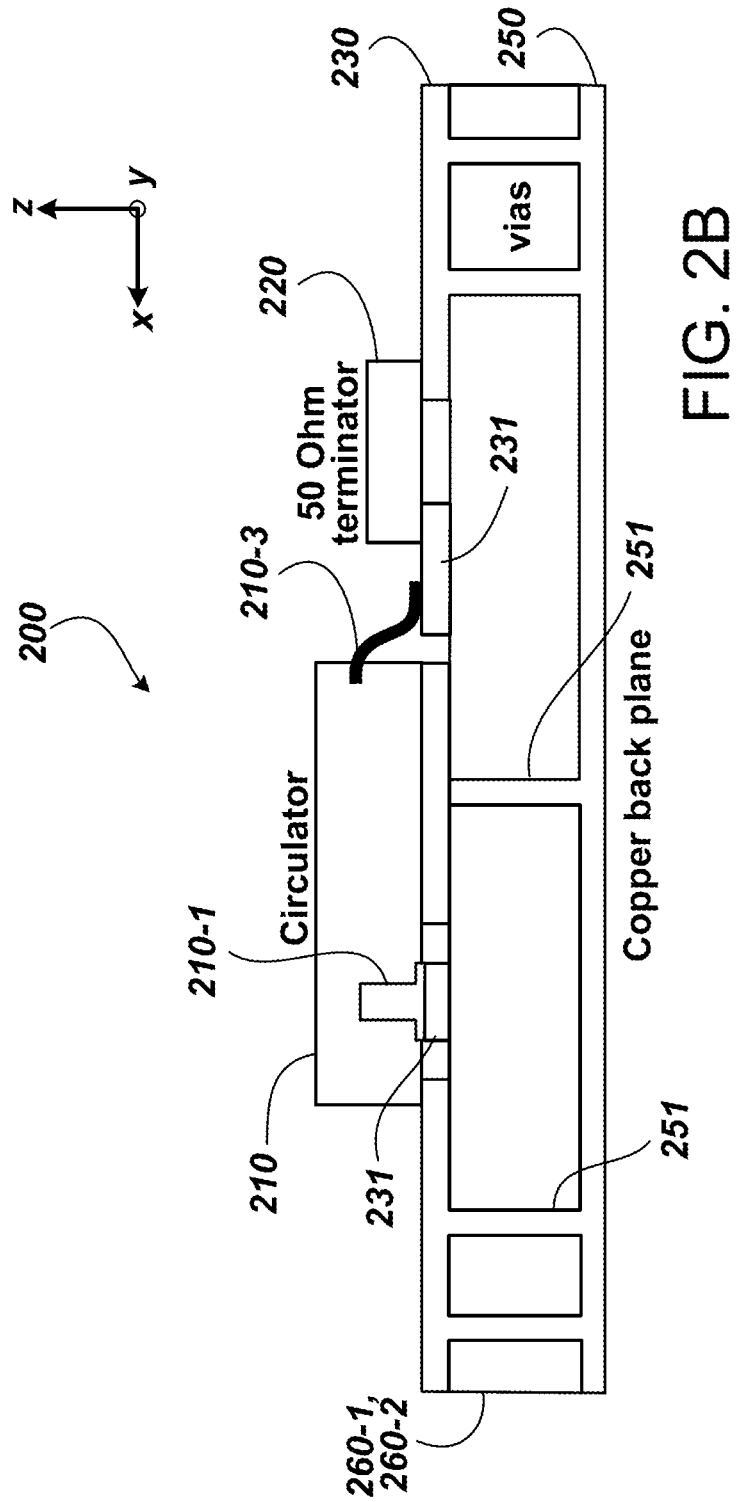

INTEGRATED READOUT CARD

CROSS REFERENCE TO RELATED APPLICATIONS

This application claims priority to U.S. Provisional Application No. 62/941,230, filed on Nov. 27, 2019. The disclosure of the prior application is considered part of and is incorporated herein by reference in its entirety.

TECHNICAL FIELD

This present disclosure relates to readout systems for qubits.

BACKGROUND

Large-scale quantum computers have the potential to provide fast solutions to certain classes of difficult problems. Multiple challenges in the design and implementation of quantum architecture to control, program and maintain quantum hardware impede the realization of large-scale quantum computing.

SUMMARY

The present disclosure describes technologies for implementing an integrated readout card for qubits.

In general, one innovative aspect of the subject matter of the present disclosure may be embodied in an integrated qubit readout circuit including a superconducting parametric amplifier, a circuit board arranged to mount the superconducting parametric amplifier and a circulator mounted on the circuit board and connected to the superconducting parametric amplifier, wherein the circulator comprises a termination port electrically connected to a termination resistor arranged to terminate a pump tone received by the superconducting parametric amplifier, and wherein the termination resistor is mounted on the circuit board.

The foregoing and other implementations can each optionally include one or more of the following features, alone or in combination.

In some implementations, at least part of an external surface of the termination resistor is in direct contact with the circuit board.

In some implementations, at least part of an external surface of the circulator is in direct contact with the circuit board.

In some implementations, the circuit board comprises a front plane layer, a signal layer, a back plane layer, and a support layer. The front plane layer is disposed on a first side of the support layer and the back plane layer is disposed on a second side of the support layer that is opposite to the first side. The signal layer is disposed between the front plane layer and the back plane layer within the support layer. The circulator and the termination resistor are mounted on the first side of the support layer such that at least one surface of the circulator and the termination resistor is in direct contact with the front plane layer.

In some implementations, the superconducting parametric amplifier is mounted on the signal layer.

In some implementations, the front plane layer, the second signal layer and the back plane layer comprise a second conductor whose thermal conductivity is larger than 300 W/m/K at 10 mK temperature, and the circulator and the termination resistor are mounted on the front plane layer.

In some implementations, the support layer comprises a first via arranged to electrically and thermally connect a first part of the front plane layer in contact with the at least part of an external surface of the circulator to the back plane layer, and the support layer comprises a second via arranged to electrically connect a second part of the front plane layer to the signal layer.

In some implementations, the first conductor comprises aluminum and the second conductor comprises copper.

In some implementations, the back plane layer is connectable to a heat sink.

In some implementations, the at least part of the external surface of the circulator in direct contact with the circuit board comprises a material whose thermal conductivity is larger than 300 W/m/K at 10 mK temperature.

In some implementations, the integrated qubit readout circuit further comprises a magnetic shield disposed around the superconducting parametric amplifier, arranged to shield the superconducting parametric amplifier from magnetic fields of the circulator.

In some implementations, the magnetic shield comprises a tube-shaped body comprising a mu-metal arranged to enclose the superconducting parametric amplifier when the magnetic shield is mounted on the circuit board.

In some implementations, the circuit board comprises a first slot arranged on a first side of the superconducting parametric amplifier and a second slot arranged on a second side of the superconducting parametric amplifier. The first slot and the second slot are dimensioned so as to receive the magnetic shield, and a distance between the first slot and the second slot matches a diameter of the magnetic shield.

In some implementations, the first signal layer comprises a strip line waveguide.

In some implementations, the first signal layer comprises a directional coupler formed with the strip line waveguide.

In some implementations, the circulator comprises a passive ferrite circulator.

In some implementations, the termination resistor comprises a 50 Ohm resistor.

In some implementations, a qubit readout assembly is provided which includes an expansion board connectable to a cold finger of a cryostat, a plurality of the integrated qubit readout circuits. The expansion board is configured to receive the plurality of the integrated qubit readout circuits such that the plurality of the integrated qubit readout circuits are mounted on the expansion board. The expansion board is configured such that the expansion board and the plurality of the integrated qubit readout circuits are in a thermal equilibrium with the cold finger of the cryostat when the expansion board is connected to the cold finger and the plurality of the integrated qubit readout circuits are mounted on the expansion board. The expansion board is configured to provide electrical connections between a circuit in contact with the cold finger and the plurality of the integrated qubit readout circuits.

The details of embodiments are set forth in the accompanying drawings and the description below. Other aspects will be apparent from the description and drawings, and from the claims.

BRIEF DESCRIPTION OF THE DRAWINGS

FIGS. 2a to 2c are schematics that illustrate an exemplary integrated circuit board for qubit readout circuit

DETAILED DESCRIPTION

Figure 1:
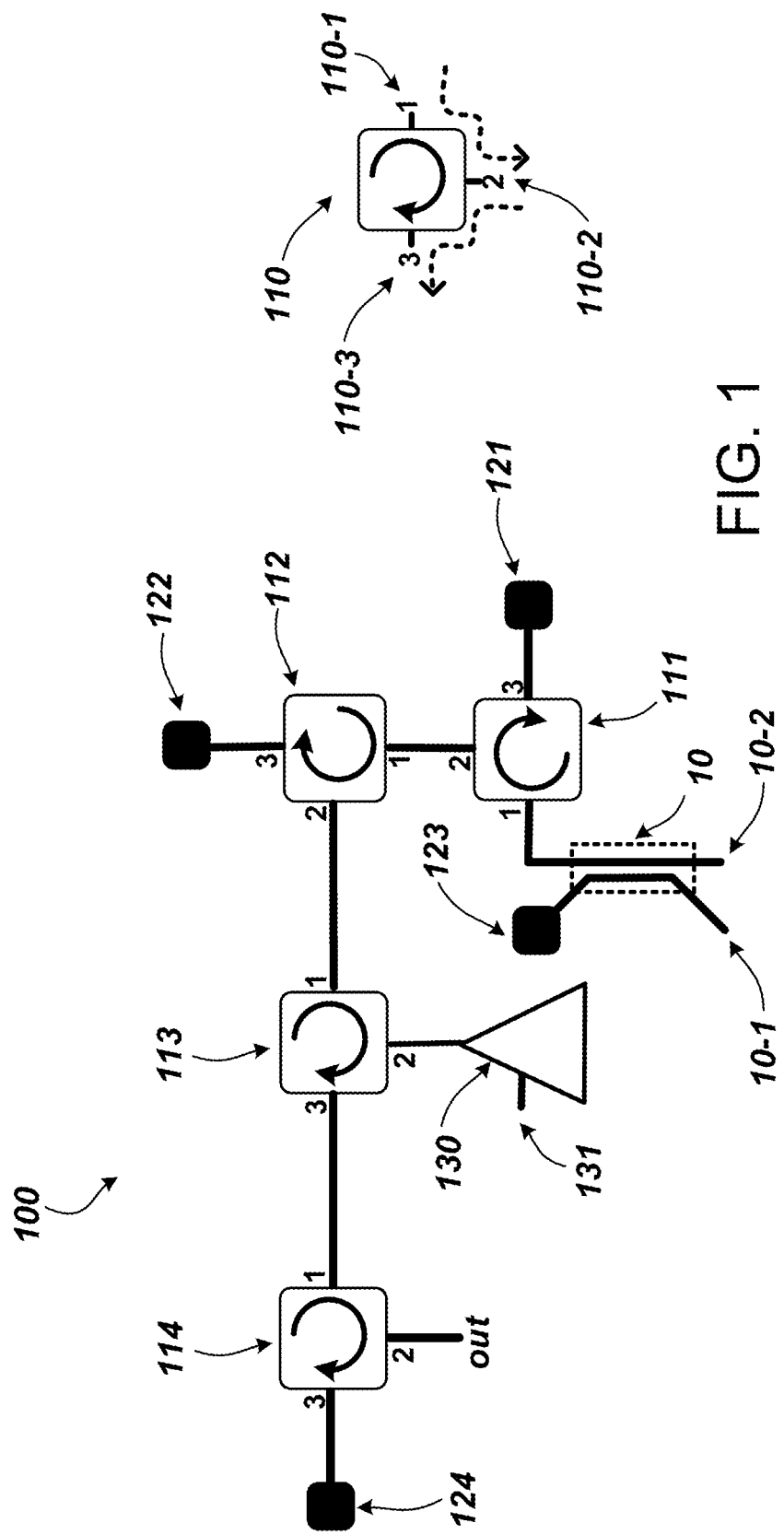
FIG. 1 is a schematic that illustrates an exemplary qubit readout circuit.

Quantum computing entails coherently processing quantum information stored in the quantum bits (qubits) of a quantum computer. Superconducting quantum computing is a promising implementation of solid-state quantum computing technology in which quantum information processing systems are formed, in part, from superconducting materials. To operate quantum information processing systems that employ solid-state quantum computing technology, such as superconducting qubits, the systems are maintained at extremely low temperatures, e.g., in the 10 s of mK. The extreme cooling of the systems keeps superconducting materials below their critical temperature and helps avoid unwanted state transitions. To maintain such low temperatures, the quantum information processing systems may be operated within a cryostat, such as a dilution refrigerator.

In some implementations, control signals are generated in higher-temperature environments, such as room-temperature, and are transmitted to the quantum information processing system using shielded impedance-controlled GHz-capable transmission lines, such as coaxial cables. The cryostat may step down from room-temperature (e.g., about 300 K) to the operating temperature of the qubits in one or more intermediate cooling stages. For instance, the cryostat may employ a stage maintained at a temperature range that is colder than room temperature stage by one or two orders of magnitude, e.g., about 30-40 K or about 3-4 K, and warmer than the operating temperature for the qubits (e.g., about 10 mK or less).

In some implementations, the state measurement of superconducting qubits is achieved using a dispersive detection scheme. In order to read out or detect the state of any qubit, a probing signal, a travelling microwave, may be excited along a readout transmission line coupled to the qubit via a respective readout resonator. The frequency of the probing signal may be in the vicinity of the resonance frequency of the readout resonator. Depending on the internal quantum mechanical state of the qubit, the intensity and the phase of the probing signal transmitted along the readout transmission line may be altered because the reflectivity of the readout resonator coupled to the qubit changes depending on the state of the qubit. This allows for the state detection of the qubits.

Even at the extremely low qubit operating temperatures, qubits may still suffer from decoherence and gate errors. Therefore, for high fidelity state measurements of superconducting qubits with near quantum-limited noise performance, a Josephson junction parametric amplifier may be constructed and used as a preamplifier for the probing signal. Within the Josephson junction parametric amplifier, a Josephson junction acts as a nonlinear inductor where the inductance is dependent on the intensity of a pump tone received at the Josephson junction. In other words, the inductance of the Josephson junction is dependent on the flux applied through a SQUID loop which includes the Josephson junction. This inductance can be modulated by applying a flux pump tone to the SQUID loop. The Josephson junction parametric amplifier can impart part of the energy of the pump tone to the probing signal, leading to the parametric amplification of the probing signal.

The dispersive detection scheme further requires, in addition to the Josephson junction parametric amplifier as a preamplifier, circulators for isolation of the signals and directional couplers for combining signals. In particular, using circulators for isolation requires impedance matching with a terminating resistor attached one of the ports of the circulators for termination, as will be explained later. Due to the heat dissipated, it is crucial to properly thermalize the termination resistor, such as a 50 Ohm resistor within the cryostat. As the number of qubits increases, the number of the termination resistors attached to the circulators also increases, which may raise a challenge in thermalizing all of the termination resistors properly inside a cryostat. If the termination resistors are not well thermalized, the temperature of the termination resistors may stay higher than that of the base temperature of the cryostat. The energy dissipated at the 50 Ohm resistors may radiate noise which can affect qubit performance and lead to degradation of the coherence via dephasing of the qubits.

Using conventional prototype hardware for circulators, directional couplers, and termination resistors for the dispersive readout scheme may not be suitable for superconducting quantum systems with a large number of qubits to implement error correction algorithms. This is mainly due to the constraint in the available space within the cryostat. Since all of the hardware for the dispersive readout scheme must be mounted on a mix plate at the mK-stage of the dilution refrigerator, space constraints become severe as the number of qubits increases. The number of modules which can fit in the available volume within the dilution refrigerator may be limited if the modules are assembled using conventional prototype hardware. A typical number of readout lines in such a system is 12. Additionally, the conventional prototype hardware does not lend itself easily to efficient thermalization. For example, in case the 50 Ohm resistor is provided by a 50 Ohm SubMiniature version A (SMA) terminator cap, the heat generated at the 50 Ohm SMA terminator cap may be difficult to thermalize properly because of the geometry of the SMA terminator which does not allow a large surface contact for cooling. Furthermore, using multiple SMA connectors in the signal path may lead to signal loss which lowers the signal to noise ratio of the detected signals.

The present disclosure relates to an integrated circuit board on which components of the dispersive readout scheme are mounted together. The integrated circuit board may also be referred to as an "integrated readout card". The integrated circuit board may include the Josephson junction preamplifiers, circulators and 50 Ohm terminators directly mounted on the circuit board. These components can be connected by signal lines fabricated directly on a conducting layer on the integrated circuit board for low loss connection between components and reduced volume. Directional couplers can be directly fabricated on the conducting layer out of the signal lines to further reduce the volume of the readout circuit. This allows for a compact design in which most components can be surface mounted and soldered or wire bonded directly into the circuit board.

The integrated circuit board may contain multiple conducting layers. A signal layer may be buried within the volume of a dielectric support layer. A front plane layer and a back plane layer may be provided on both sides of the support layer to serve as an electric ground and a thermal anchor. Most of the components can be mounted on the front plane layer to have a large surface contact with the front plane layer. Since the front plane layer and the back plane layer are connected with conducting vias, heat generated from the components may be dissipated efficiently to the back plane layer, which is again connected to a heat sink or directly to the mixing plate of the dilution refrigerator. Such integrated circuit board may allow for a high degree of integration of the readout circuit compact while providing an efficient thermalization.

FIG. 1 is a schematic that illustrates an exemplary qubit readout circuit.

A qubit readout circuit 100 may include a first circulator 111, a second circulator 112, a third circulator 113 and a fourth circulator 114. The qubit readout circuit 100 further includes a first termination resistor 121, a second termination resistor 122, a third termination resistor 123 and a fourth termination resistor 124. The qubit readout circuit 100 further includes a Josephson parametric amplifier 130.

A circulator 110 is a passive device which usually includes three or four ports. A signal entering one of the ports 110-1, 110-2, 110-3 is transmitted to another one of the ports 110-1, 110-2, 110-3 but only in one direction. As illustrated on the right panel of FIG. 1, a circulator 110 in this implementation includes three ports 110-1, 110-2, 110-3. As illustrated with dotted lines in the right panel, when a signal enters the first port 110-1 of the isolator 110, the signal is transmitted to the second port 110-2 of the circulator 110 and exits the second port 110-2 of the circulator 110. When a signal enters the second port 110-2 of the circulator 110, the signal is transmitted to the third port 110-3, but not the first port 110-1, and exits at the third port 110-3 of the circulator 110. Throughout this implementation, a first port, a second port, and a third port included in the first to fourth circulators 111, 112, 113, 114 follow this convention.

In the readout circuit 100, an input signal is received at the first port 111-1 of the first circulator 111.

In some implementations, the input signal may be provided by a travelling microwave reflected from a readout resonator coupled to a qubit. The frequency of the travelling microwave, a probe signal, may be at the resonance frequency or in the vicinity of the resonance frequency of the readout resonator. Since the readout resonator is coupled to the qubit, the resonance frequency of the readout resonator changes depending on the state of the qubit. Therefore, depending on the internal quantum mechanical state of the qubit, the intensity or phase of the probing signal may be altered, which allows for the state detection of the qubits.

In some implementations, the input signal may be provided by a travelling microwave reflected from one of a plurality of readout resonators coupled to a plurality of respective qubits. The plurality of readout resonators may be coupled to a common readout transmission line. A travelling microwave, a probe signal, may be excited to travel along the readout transmission line. The frequency of the probe signal, may be at the resonance frequency or in the vicinity of the resonance frequency of one of the readout resonators. Since the plurality of readout resonators are coupled to the plurality of respective qubits, the resonance frequency of the readout resonator changes depending on the state of the qubit. Therefore, depending on the internal quantum mechanical state of the probed qubit, the intensity or phase of the probing signal may be altered, which allows for the state detection of the qubits.

In some implementations, the input signal may be provided by a probe signal comprising multiple tones of a travelling microwave reflected from a respective plurality of readout resonators coupled to a plurality of respective qubits. The plurality of readout resonators may be coupled to a common readout transmission line. The frequency of each of the multiple tones of the probe signal, may be at the resonance frequency or in the vicinity of the resonance frequency of a respective one or the plurality of the readout resonators. Since the plurality of readout resonators are coupled to the plurality of respective qubits, the resonance frequency of the readout resonator changes depending on the state of the qubit. Therefore, depending on the internal quantum mechanical state of the probed qubits, the intensity or phase of each tone of the probing signal may be altered, which allows for the state detection of the qubits.

In the example of FIG. 1, a reflection scheme for measuring the states of the qubits is shown where only one line connects the qubit chip to the readout circuit 100 via a directional coupler 10. The probing signal is input into an input port 10-1 of the directional coupler 10. Most of the power of the probing signal input into the input port 10-1 is dissipated at the third termination resistor 123. A fraction of power, determined by the coupling coefficient of the directional coupler 10, of the probing signal is coupled into a coupled port 10-2 of the directional coupler 10 and sent to the plurality of readout resonators respectively coupled to the plurality of qubits in the qubit chip. Therefore, the intensity or power of the probing signal input into the input port 10-1 of the directional coupler 10 is set to be larger than the level of intensity or power intended for the readout circuit 100 in view of the coupling coefficient of the directional coupler 10. The coupling coefficient of the directional coupler 10 may be decided by considering parameters including the signal-to-noise ratio of the measurement and heat dissipation at the third termination resistor 123. The coupling coefficient of the directional coupler 10 may be set to be as low as possible in order to minimize the attenuation of the probing signal reflected off the readout resonators at the directional coupler 10 before the probing signal is input into the first port 111-1 of the first circulator 111. However, this is balanced by the fact that the power of the probing signal 10-1 needs to be accordingly large to maintain the level of the probing signal in the readout circuit 100, which increases heat dissipation at the third termination resistor 123.

The probe signal is then transmitted to the second port 111-2 of the first circulator 111 and exits the first circulator 111 through the second port 111-2 and passes to the second circulator 112. The third port 111-3 of the first circulator 111 is terminated with the first termination resistor 121. The first to fourth termination resistors 121, 122, 123, 124 are a matched load to the transmission line forming the circulators 111, 112, 113, 114 and the connections between the circulators 111, 112, 113, 114. For example, when the impedance of the transmission lines is 50 Ohms, the resistance of the termination resistors 121, 122, 123, 124 is 50 Ohms.

If any signal is transmitted back to the second port 111-2 of the first circulator 111 reflected from a component in the later stage of the qubit readout circuit 100, the reflected signal exits from the third port 111-3 of the first circulator 111 and becomes terminated or dissipated at the first termination resistor 121. Therefore, between the unterminated ports of the first circulator 111, the first port 111-1 and the second port 111-2 of the first circulator 111, the signal can travel only in one direction, namely from the first port 111-1 to the second port 111-2. Therefore, a circulator 111, 112, 113, 114 with the third port 110-3, 111-3, 112-3, 113-3, 114-3 terminated with a termination resistor 121, 122, 123 acts as an isolator, which is used to shield components coupled to the first port 110-1, 111-1, 112-1, 113-1, 114-1 from any back-propagating microwave signals from the subsequent components.

In the qubit readout circuit 100, the third ports 111-3, 112-3, 114-3 of the first circulator 111, the second circulator 112, and the fourth circulator 114 are terminated with the first termination resistor 121, the second termination resistor 122, and the fourth termination resistor 124, respectively, therefore configured as isolators. These are to protect the qubits connected to the first port 111-1 of the first circulator 111 from back-propagating signals, as will be explained in more detail below.

The second port 111-2 of the first circulator 111 is electrically connected, via a matched transmission line, to the first port 112-1 of the second circulator 112. The third port 112-3 of the second circulator 112 is terminated with the second termination resistor 122. Therefore, as discussed above, the second circulator 112 also forms an isolator from the first port 112-1 to the second port 112-2. When the probe signal outputted from the second port 111-2 of the first circulator 111 enters the first port 112-1 of the second circulator 112, the probe signal exits the second port 112-2. If any back-reflected spurious signal enters the second port 112-2 of the second circulator 112, it is subsequently transmitted to the third port 112-3 of the second circulator 112 and terminated. Therefore, the second circulator 112 is terminated with the second termination resistor 122 at the third port 112-3 which serves as a further shielding of the qubits in addition to the isolator formed by the first circulator 111 and the first termination resistor 121.

The second port 112-2 of the second circulator 112 is electrically connected, via a matched transmission line, to the first port 113-1 of the third circulator 113. The probe signal enters the first port 113-1 of the third circulator 113 and exits through the second port 113-2 of the third circulator towards the Josephson junction parametric amplifier 130.

Parametric amplifiers are nonlinear devices in which a reactance in the circuit is modulated by a pump tone of frequency fp to facilitate amplification and frequency conversion from a first band of frequencies Δf centered around f1 to a second band of frequencies Δf centered around f2, such that fp=f1+f2.

For example, if a pump tone at 11 GHz is provided to the Josephson junction parametric amplifier 130 and the frequency of the probe signal is 5 GHz, the Josephson junction parametric amplifier 130 up-converts the frequency of the first signal into 6 GHz. If a pump tone at 10 GHz is provided to the Josephson junction parametric amplifier 130 and the frequency of the probe signal is 5 GHz, the Josephson junction parametric amplifier 130 outputs a signal at 5 GHz. In both cases, the intensity of the probe signal can be amplified to a degree dependent on the amplitude of the pump tone. In both cases, the probe signal at 5 GHz is also amplified.

The pump tone is received at the Josephson parametric amplifier 130 via a pump terminal 131.

The Josephson junction parametric amplifier 130 outputs an amplified probe signal back into the second port 113-2 of the third circulator 113. The amplified probe signal exits through the third port 113-3 of the third circulator 113.

In some implementations, in place of the Josephson junction parametric amplifier 130, the Josephson junction parametric converter may be used for the qubit readout circuit 100. Parametric converters are nonlinear devices in which a reactance in the circuit is modulated by a pump tone of frequency fp to facilitate amplification and frequency conversion from a first band of frequencies Δf centered around f1 to a second band of frequencies Δf centered around f2, such that fp=f2−f1.

The amplified probe signal enters the first port 114-1 of the fourth circulator 114 and is outputted at the second port 114-2 of the fourth circulator 114. Since the third port 114-3 of the fourth circulator 114 is terminated with the fourth termination resistor 124, the fourth circulator also acts as an isolator.

In some implementations, the qubit readout circuit 100 may correspond to a pre-amplification stage before the signals are combined or multiplexed for further amplification. For example, the output signal from the second port 114-2 of the fourth circulator 114 may be amplified by a HEMT (High Electron Mobility Transistor) amplifier before processing.

The number of isolators, which are circulators 111, 112, 114 terminated with a termination resistors 121, 122, 124, required for the qubit readout circuit 100 may vary depending on the requirement or the components attached to the output of the qubit readout circuit 100.

The qubit readout circuit 100 shown in FIG. 1 includes one isolator 114, 124 between the output terminal 114-2 and the Josephson junction parametric amplifier 130. This is mainly to shield the Josephson junction parametric amplifier from the signals reflected from subsequent components, such as a HEMT amplifier. The degree of isolation may depend on the isolation ratio of each circulator 111, 112, 114, which ranges from 20 to 40 dB rejection. If a higher degree of isolation is required, further isolators, which are circulators terminated with a termination resistor, can be cascaded to the second port 114-2 of the fourth circulator 114.

The qubit readout circuit 100 shown in FIG. 1 includes two isolators 111, 112, 121, 122 between the input terminal 111-1 and the Josephson junction parametric amplifier 130. This is mainly to shield the qubits from either the pump tone propagating from the Josephson parametric amplifier 130 or amplified noise emitted from the Josephson parametric amplifier 130. Since the circulator 111, 112, 113, 114 have a finite bandwidth, the pump tone may be out of band with the circulators 111, 112, 113, 114. For example, when the circulator operates from 4 to 7 GHz and the frequencies of the probe signal and the amplified probe signal are at 5 GHz, the frequency of the pump tone is 10 GHz, which is out of band of the operation bandwidth of the circulator. Therefore, the isolation ratio of the circulators 111, 112 may be lower than specified. Also, when the pump tone is far away from the resonance frequencies of the readout resonators in the qubit chip, it may not affect the performance of the qubits significantly. Therefore, the two isolators 111, 112, 121, 122 between the input terminal 111-1 and the Josephson junction parametric amplifier 130 may be mainly used to suppress the amplified noise from the Josephson junction parametric amplifier from propagating to the qubits. The pump tone whose intensity is 10's of nW, is in general much more intense than the probe signal. For example, the power of the pump tone may be from −70 dBm to −40 dBm whereas the power of the probe signal may be from −130 to −110 dBm. If a higher degree of isolation is required, further isolators, each comprising a circulator terminated with a termination resistor, can be disposed between the input port 111-1 and the first port 113-1 of the third circulator 113. Therefore, if the readout circuit 100 may be designed such that more isolators can be added without occupying much volume within the experimental space of the cryostat.

Any unwanted signals propagating the wrong direction through a circulator 111, 112, 113, 114 will be terminated at the termination resistors 121, 122, 123, 124. Properly thermalizing the terminating resistors 121, 122, 123, 124 may prevent this energy from re-radiating toward the qubit, which can otherwise affect the coherence of the qubits. In addition to the termination resistors, 121, 122, 123, 124, which are the major sources of heat dissipation, the circulators 111, 112, 113, 114 themselves may dissipate heat because the conductors within the circulators 111, 112, 113, 114 which have finite resistance can dissipate the pump tone. Therefore, the heat dissipated at the qubit readout circuit 100 needs to be efficiently channeled to a heat sink for the coherence of the qubits.

Figure 2A:
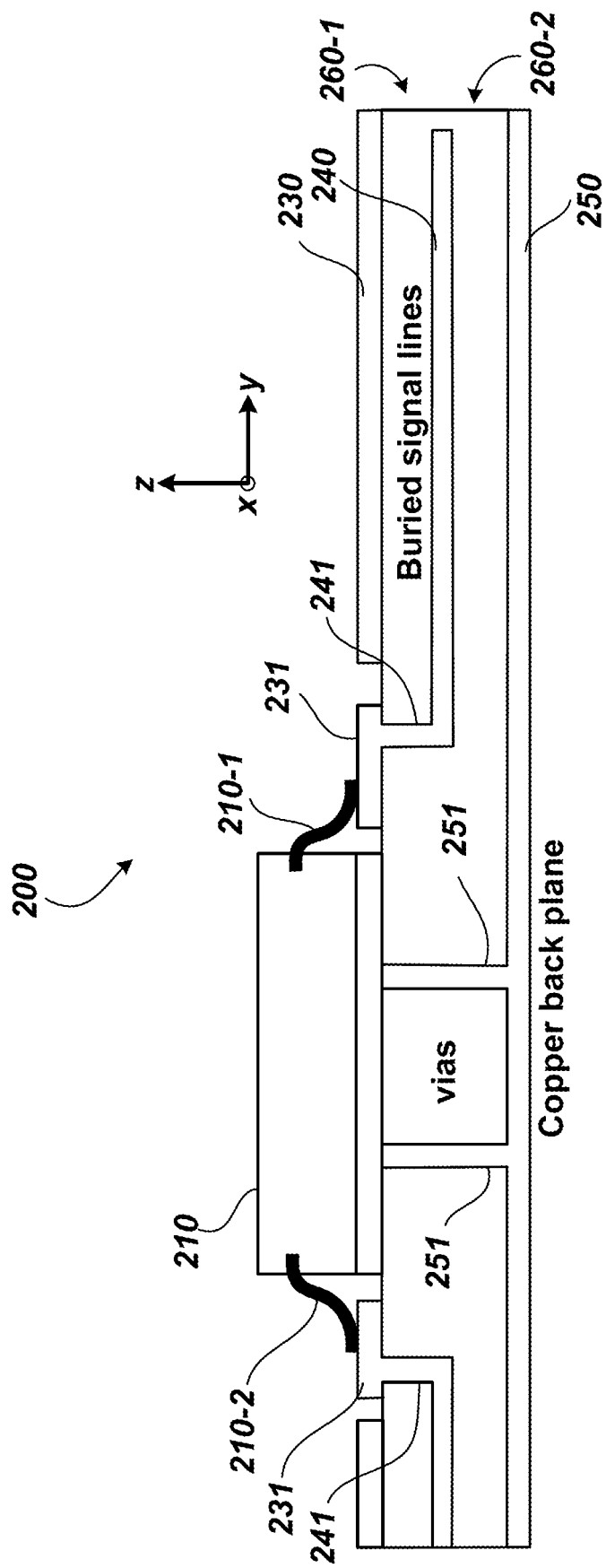
Figure 2C:
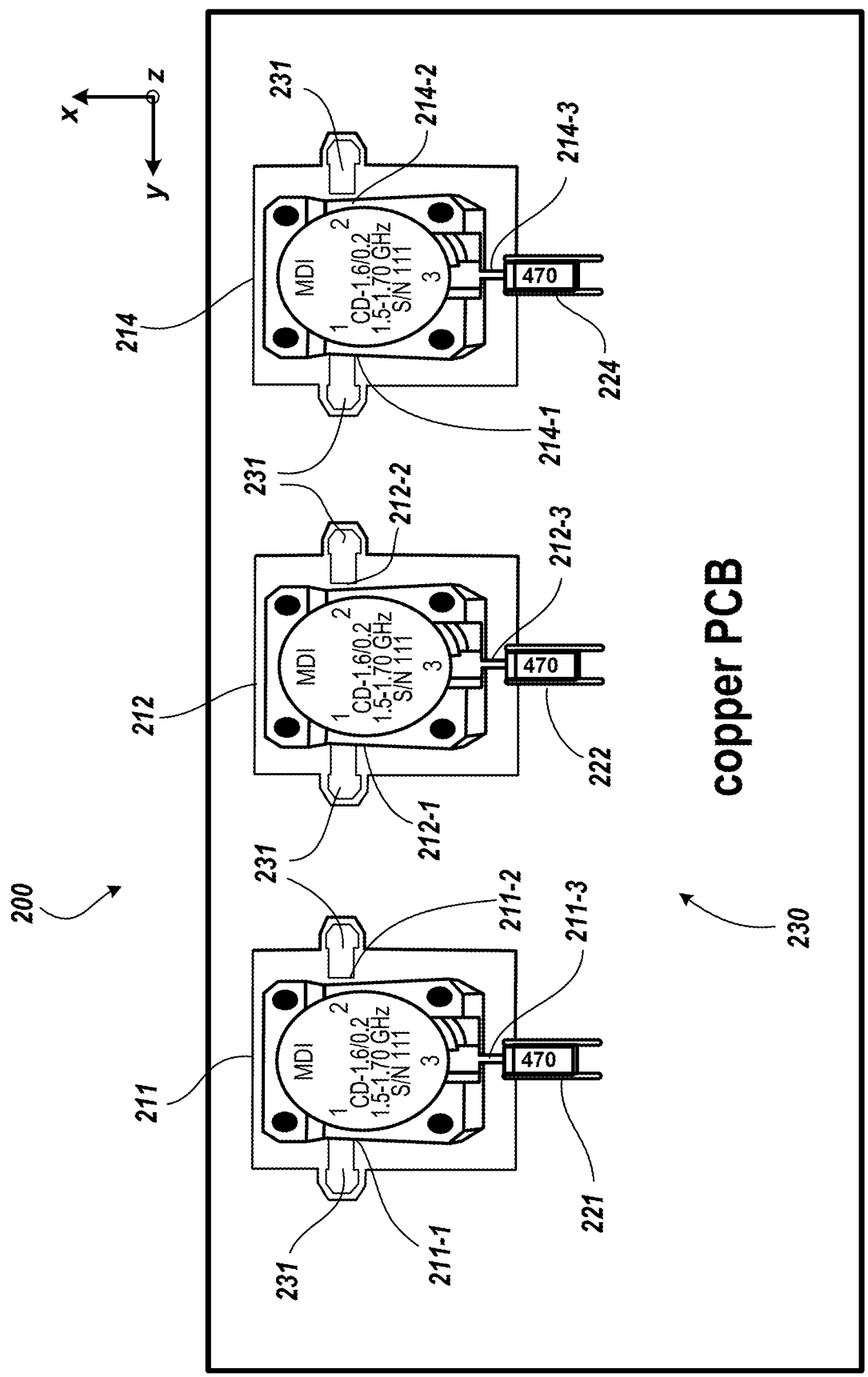

FIGS. 2a to 2c are schematics that illustrate an exemplary integrated circuit board for a qubit readout circuit shown in FIG. 1.

FIGS. 2a and 2b show a circulator 210, which can be any one of the circulators 111, 112, 113, 114 shown in FIG. 1, mounted on an integrated circuit board 200. FIGS. 2a and 2b show the circulator 210 mounted on the integrated circuit board 200 viewed in two different directions. In particular, FIG. 2a shows a cross section of the integrated circuit board 200 and the circulator 210, along the y-z plane and FIG. 2b shows a cross section of the integrated circuit board 200 and the circulator 210, along the x-z plane.

As shown in FIG. 2a, the circulator 210 includes a first port 210-1 and a second port 210-2. As shown in FIG. 2b, the circulator 210 further includes a third port 210-3 which is electrically connected to a termination resistor 220.

The integrated circuit board 200 includes three conducting layers, a front plane layer 230, a signal layer 240 and a back plane layer 250 and one dielectric layer, a first support layer 260-1 and a second support layer 260-2. The first support layer 260-1 is disposed between the front plane layer 230 and the signal layer 240. The second support layer 260-2 is disposed between the signal layer 240 and the back plane layer 250.

In some implementations, the front plane layer 230, the signal layer 240 and the back plane layer 250 are substantially parallel to one another.

In some implementations, the front plane layer 230, the signal layer 240 and the back plane layer 250 comprise the same conducting material.

In some implementations, the front plane layer 230, the signal layer 240 and the back plane layer 250 comprise copper which provides a high thermal conductivity for efficient thermalization and a high electrical conductivity such that a significant signal loss is prevented within the integrated circuit board 200. It is not essential for the front plane layer 230, the signal layer 240 or the back plane layer 250 to be superconducting at the operating temperature of the qubits.

In some implementations, the back plane layer 250 may comprise aluminum. Aluminum is superconducting at the temperature given by the mixing plate of the dilution refrigerator. Therefore, the signal transmission becomes largely lossless.

The Josephson junction parametric amplifier 130 may be formed on a separate chip comprising an aluminum layer and electrically connected to the signal layer 240 via, for example, wire bonding.

The first support layer 260-1 and the second support layer 260-2 provide an overall planar shape of the integrated circuit board.

The examples of the material for the first support layer 260-1 and the second support layer 260-2 include a dielectric material such as Rogers, which is both compatible with microwave circuits and cryogenic temperatures.

In some implementations, the front plane layer 230 and the back plane layer 250 may be disposed on both sides of the plane of the support layer 260, as shown in FIGS. 2a and 2b.

In some implementations, the signal layer 240 is buried within the support layer 260 and not exposed to the outside environment.

In some implementations, the signal layer 240 may comprise one or more stripline waveguides, where the waveguide circuit is defined by strips of metal fabricated within the signal layer 240, and the front plane layer 230 and the back plane layer 250 act as ground planes.

In some implementations, the front plane layer 230 may comprise one or more co-planar waveguides, where the waveguide circuit is defined by the strips of metal fabricated within the front plane layer 230 with return tracks defined on either side of the strips, also fabricated within the front plane layer 230.

The stripline waveguides comprised by the signal layer 240 may form a waveguide circuit within in a plane parallel to the front plane layer 230 and the back plane layer 250.

In some implementations, in case the signal layer 240 is buried within the support layers 260-1, 260-2, the plane within which the signal layer 240 is formed may be equidistant from the front plane layer 230 and the back plane layer 250. For example, if the signal layer 240 comprises one or more stripline waveguides, in order to ensure 50 Ohm impedance in the stripline waveguides throughout the plane of the signal layer, the signal layer 240 is positioned equidistant from the plane layer 230 and the back plane layer 250. However, as far as the signal layer 240 is not exposed from the support layer 260, and the waveguides comprised by the signal layer 240 can maintain the impedance required for the operation, the position of the signal layer 240 can be anywhere between the front plane layer 230 and the back plane layer 250.

In some implementations, the front plane layer 230 may be patterned to form one or more solder pads 231. The solder pads 231 can be patterned such that they are electrically disconnected from an electric ground formed in other regions of the front plane layer 230, which will form an electric ground.

In some implementations, as shown in FIGS. 2a and 2b, the terminals of the circulator 210, forming respectively the first port 210-1, the second port 210-2, and the third port 210-3 of the circulator 210, are directly wire bonded to the solder pads 231.

Alternatively, the terminals of the circulator 210, forming respectively the first port 210-1, the second port 210-2, and the third port 210-3 of the circulator 210, may include conducting pins. In this case, the conducting pins can be directly soldered to the solder pads 231.

The area of the solder pads 231 are arranged to be large enough for wire bonding or soldering to be possible.

The electrical connection between the ports 210-1, 210-2, 210-3 of the circulator 210 and the solder pads 231 are not limited to wire bonding or soldering. As long as the connection is compatible with high frequency signals, for example 1 MHz or higher, and the connection can withstand a cryogenic temperature of operation, any connection method can be used.

The integrated circuit board 200 further includes one or more signal vias 241. The signal vias 241 comprise a conducting material. In some implementations, the signal vias 241 comprise the same material as the front plane layer 230 and the signal layer 240. In some implementations, the signal vias extend in a direction perpendicular to the plane of the integrated circuit board 200 and electrically connects the solder pads 231 to the respective signal lines within the signal layer 240. In some implementations, the signal vias 241 extend in any direction from the front plane layer 230 to the signal layer 240 to electrically connect the solder pads 231 to the respective signal lines within the signal layer 240.

In the cross sections shown in the example of FIGS. 2a and 2b, only the signal lines connected to the solder pads 231 connected to the first port 210-1 and the second port 210-2 are shown. Therefore, the cross section of the integrated circuit board 200 shown in FIG. 2b does not show any part of the signal line 240.

Parts of the front plane layer 230 which are not connected to the solder pads 231 form an electrical ground.

The integrated circuit board 200 further includes one or more ground vias 251. The ground vias 251 comprise a conducting material. In some implementations, the ground vias 251 comprise the same material as the front plane layer 230 and the back plane layer 250. In some implementations, the ground vias 251 extend in a direction perpendicular to the plane of the integrated circuit board 200 and electrically connects part of the front plane layer 230 not electrically connected to the solder pads 231 to the back plane layer 250. In some implementations, the ground vias 251 extend in any direction from the front plane layer 230 to the back plane layer 250 to electrically connect part of the front plane layer 230 not electrically connected to the solder pads 231 to the back plane layer 250.

The part of the front plane layer 230 not electrically connected to the solder pads 231 and the back plane layer 250, connected to each other via the ground vias 251 form an electrical ground.

Heat dissipated into the front plane layer 230 is transferred to the back plane layer 250 via the ground vias 251. Therefore, the cross section of the ground vias 251 may be arranged such that the ground vias 251 can transmit heat from the front plane layer to the back plane layer without heating up significantly at any point of the ground vias 251.

In some implementations, the back plane layer 230 may be arranged to be in direct contact with the mixing plate of the dilution refrigerator such that heat transferred to the back plane layer 230 is taken from the integrated circuit board 200 and dissipated.

Alternatively, the back plane layer 230 is arranged to be in a shape connectable to a heat sink, which can be maintained at a thermal equilibrium with the mixing plate of the dilution refrigerator.

FIGS. 2a and 2b show that the circulator 210 and the termination resistor 220 are surface mounted on the front plane layer 230. In some implementations, the circulator 210 and the termination resistor 220 may be constructed as a so-called "drop-in" component, which has a low-profile shape such that the surface contact area with the front plane layer 230 can be made as large as possible for efficient thermalization.

In some implementations, one or more sunken holes are formed within the support layer 260 to house the circulator 210 or the termination resistor 220.

The external surface of the circulator 210 is made of steel to form the field lines within the circulator 210 as desired for operation. In some implementations, the material of the external surface of the circulator 210 may further comprise annealed copper layer for thermalizing.

FIG. 2b shows that the termination resistor 220 is mounted on the front plane layer 230. FIG. 2b further shows that one end of the termination resistor 220 is electrically connected to the third terminal 210-3 of the circulator 210 via one of the solder pads 231 and that the other end of the termination resistor 220 is connected to the part of the front plane layer 230 which serves as an electric ground.

In some implementations, the external surface of the termination resistor 220, except the part which makes electrical connections with the solder pad 231 and the front plane layer 230, may be formed with a material which is not electrically conducting but has a high thermal conductivity at a cryogenic temperature.

FIG. 2c shows a top view of the integrated circuit board 200 and the first circulator 111, 211, the second circulator 112, 212, the fourth circulator 114, 214 from the qubit readout circuit 100 of FIG. 1, mounted on the front plane layer 230. As discussed above in FIG. 1, the third ports 111-3, 211-3, 112-3, 212-3, 114-3, 214-3 of the first circulator 111, 211, the second circulator 112, 212, the fourth circulator 114, 214 are each connected to a termination resistor 121, 221, 122, 222, 124, 224 such that the first circulator 111, 211, the second circulator 112, 212, the fourth circulator 114, 214 each functions as an isolator.

The front plane layer 230 is patterned such that the support layer 260 is exposed around the periphery of the circulators 211, 212, 214, represented in FIG. 2c as unshaded areas. Although not shown being blocked by the circulators 211, 212, 214, underneath each circulator 211, 212, 214, part of the front plane layer 230 is patterned to be in contact with the surface of the circulators 211, 212, 214. As shown in FIGS. 2a and 2b, these hidden parts of the front plane layer 230 are connected to the back plane layer 250 via the ground vias 251 for efficient thermal transfer.

FIG. 2c shows that the first ports 211-1, 212-1, 214-1 and the second ports 211-2, 212-2, 214-2 of the circulators 211, 212, 214 are electrically connected to respective solder pads 231. As discussed above, these electrical connections can be achieved either via direct soldering or wire bonding.

FIG. 2c shows that the third ports 211-3, 212-3, 214-3 of the circulators 211, 212, 214 are electrically connected to one end of the first termination resistor 221, the second termination resistor 222 and the fourth termination resistor 224, respectively. These connections are made directly without solder pads 231, for example, either via direct soldering or wire bonding. The other end of the first termination resistor 221, the second termination resistor 222 and the fourth termination resistor 224 is electrically connected to the front plane layer 230.

Although not shown blocked by the first termination resistor 221, the second termination resistor 222 and the fourth termination resistor 224, part of the front plane layer 230 are in contact with the bottom surfaces of the first termination resistor 221, the second termination resistor 222 and the fourth termination resistor 224 for thermal contact. These parts of the front plane layer 230 in contact with the bottom surfaces of the termination resistors 221, 222, 224 are integrally formed with the part of the front plane layer 230 which forms an electric ground and connected to the back plane layer 250 vias ground vias 251.

Compared to the case where connectors are used for electrical connections, such as stainless steel SMA connector, the integrated circuit board 200 may allow for more compact implementation and transmission of the signals with less loss. In case the front plane layer 230, the signal layer 240, the back plane layer 250, the signal vias 241, the ground vias 251 comprise a metal with high thermal conductivity, such as copper, direct contact of the components with the copper allows for more efficient thermalization.

Figure 3A:
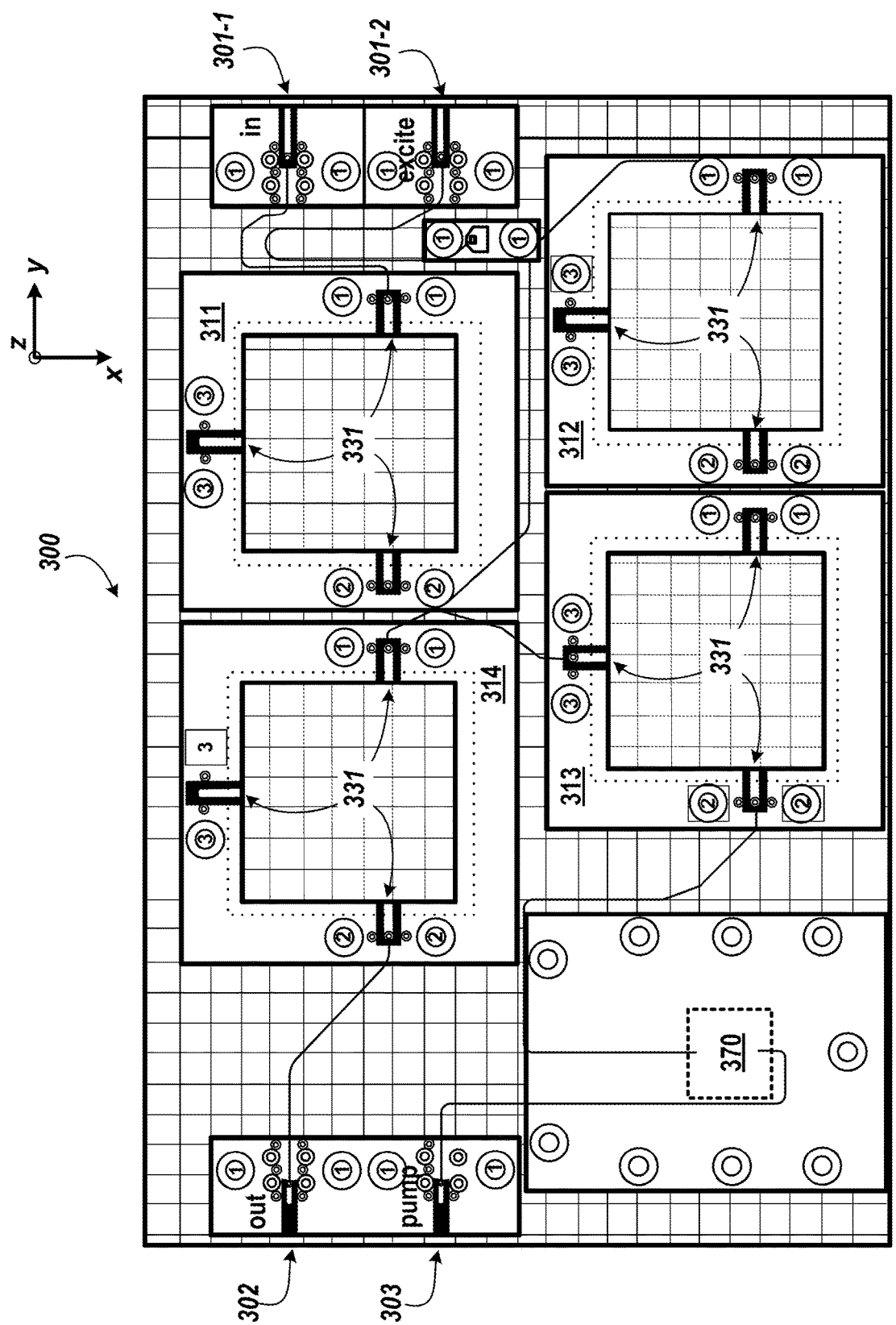
FIGS. 3a to 3c are schematics that illustrate aspects of an exemplary qubit readout circuit implemented on an integrated circuit board.

FIG. 3a is a schematic that illustrates an exemplary integrated circuit board for a qubit readout circuit with references to FIGS. 1 and 2. In particular, FIG. 3a shows a CAD drawing of a top view plan of the integrated circuit board 300 described in FIG. 2 to implement the qubit readout circuit 100 described in FIG. 1.

The integrated circuit board 300 includes four sites for the circulators 111, 211, 112, 212, 113, 114, 214, namely a first site 311 for the first circulator 111, 211, a second site 312 for the second circulator 112, 212, a third site 313 for the third circulator 113, and a fourth site 314 for the fourth circulator 114, 214.

The integrated circuit board 300 further includes a site for the Josephson junction parametric amplifier 370. The Josephson junction parametric amplifier 370 is implemented on a separate chip from the integrated circuit board 300, and can be wire bonded to the integrated circuit board 300.

The integrated circuit board 300 further includes an input terminal 301-1, an excite terminal 301-2, an output terminal 302, a pump terminal 303. Referring to FIG. 1, the input terminal 301-1 is the coupled port 10-2 of the directional coupler 10 and the excite terminal 301-2 is the input port 10-1 of the directional coupler 10. As explained in FIG. 1, the probe signal is input into the excite terminal 301-2. A portion of the probe signal is coupled into input terminal 301-1 and sent to the plurality of readout resonators coupled respectively to the plurality of qubits. The probe signal reflected from the plurality of readout resonators are transmitted back to the input terminal 301-1 and enters the integrated circuit board 300.

Each site 311, 312, 313, 314 includes three solder pad areas 331. The solder pad areas 331 are labelled in FIG. 3a as 1, 2, 3 corresponding to respectively the first ports 111-1, 211-1, 112-1, 212-1, 113-1, 114-1, 214-1, the second ports 111-2, 211-2, 112-2, 212-2, 113-2, 114-2, 214-2 and the third ports 111-3, 211-3, 112-3, 212-3, 113-3, 114-3, 214-3 of the circulators 111, 211, 112, 212, 113, 114, 214.

FIG. 3a shows that the solder pad areas 331 of the sites 311, 312, 313, 314 are connected as described in FIG. 1. For example, the solder pad area 331 of the first site 311 which is labelled as '1' is connected to the input terminal 301. The solder pad area 331 of the fourth site 314 which is labelled as '2' is connected to an output terminal 302. The pump port 303 is connected to the site for the Josephson junction parametric amplifier 370.

As discussed above in FIG. 2, each of the sites 311, 312, 313, 314 are arranged such that when the circulators 111, 211, 112, 212, 113, 114, 214 are mounted, at least part of the front plane layer 230 are in contact with at least one of the external surface of the circulators 111, 211, 112, 212, 113, 114, 214 for thermalization. The part of the front plane layer 230 which is to come in contact with the circulators 111, 211, 112, 212, 113, 114, 214 when the circulators 111, 211, 112, 212, 113, 114, 214 are mounted, are electrically and thermally connected to the back plane layer 250 via ground vias 251.

In some implementations, the sites 311, 312, 313, 314 may be formed by patterning the front plane layer 250, as depicted in FIGS. 2a and 2b such that at least one surface of the circulators 110, 210, 111, 211, 112, 212, 113, 114, 214 and the termination resistor 120, 220, 121, 221, 122, 222, 123, 124, 224 are in contact with the front plane layer 230.

In some implementations, the front plane layer 230 may be configured to have a sunken hole which houses the circulators 110, 210, 111, 211, 112, 212, 113, 114, 214 or the termination resistors 120, 220, 121, 221, 122, 222, 123, 124, 224. In this case, the front plane layer 230 and the signal layer 240 may be rearranged accordingly to facilitate electrical connections and efficient thermalization.

For example, in some implementations, the first support layer 260-1 may be formed to have a sunken hole such that the part of the front plane layer 230 to be in contact with one of the external surfaces of the circulators 110, 210, 111, 211, 112, 212, 113, 114, 214 for thermalization. This is to align the front plane layer 240 with the electrical connections or the ports 210-1, 210-2, 210-3, 210-1, 211-2, 211-3, 212-1, 212-2, 212-3, 213-1, 213-2, 213-3 of the circulators 210, 211, 212, 213 which may be positioned higher than the bottom surfaces of the circulators 210, 211, 212, 213.

Since the electrical terminals of the circulators 110, 210, 111, 211, 112, 212, 113, 114, 214 or the termination resistors 120, 220, 121, 221, 122, 222, 123, 124, 224 may be formed on the side surfaces, along the x-z plane or the y-z plane in FIG. 2, the distance between the plane with the solder pads 231 and the lowered front plane 230, or the bottom of the sunken hole, or the plane in contact with the external surfaces of the circulators 110, 210, 111, 211, 112, 212, 113, 114, 214 or the termination resistors 120, 220, 121, 221, 122, 222, 123, 124, 224 may largely match vertical the distance, along the z-axis, between the bottom surface and the electrical terminals of the circulators 110, 210, 111, 211, 112, 212, 113, 114, 214 or the termination resistors 120, 220, 121, 221, 122, 222, 123, 124, 224. These may allow straightforward soldering or wire bonding after the circulators 110, 210, 111, 211, 112, 212, 113, 114, 214 or the termination resistors 120, 220, 121, 221, 122, 222, 123, 124, 224 are dropped into the sunken hole for mounting.

The configuration of the sites 311, 312, 313, 314 where the circulators 110, 210, 111, 211, 112, 212, 113, 114, 214 are to be mounted are not limited to these implementations. As far as electrical connections can be made to the signal layer 240 via the solder pads, 231, 331 and an efficient thermal connection to the back plane layer 250 can be made via the ground vias 251, any configuration of the sites 311, 312, 313, 314 can be used.

Figure 3B:
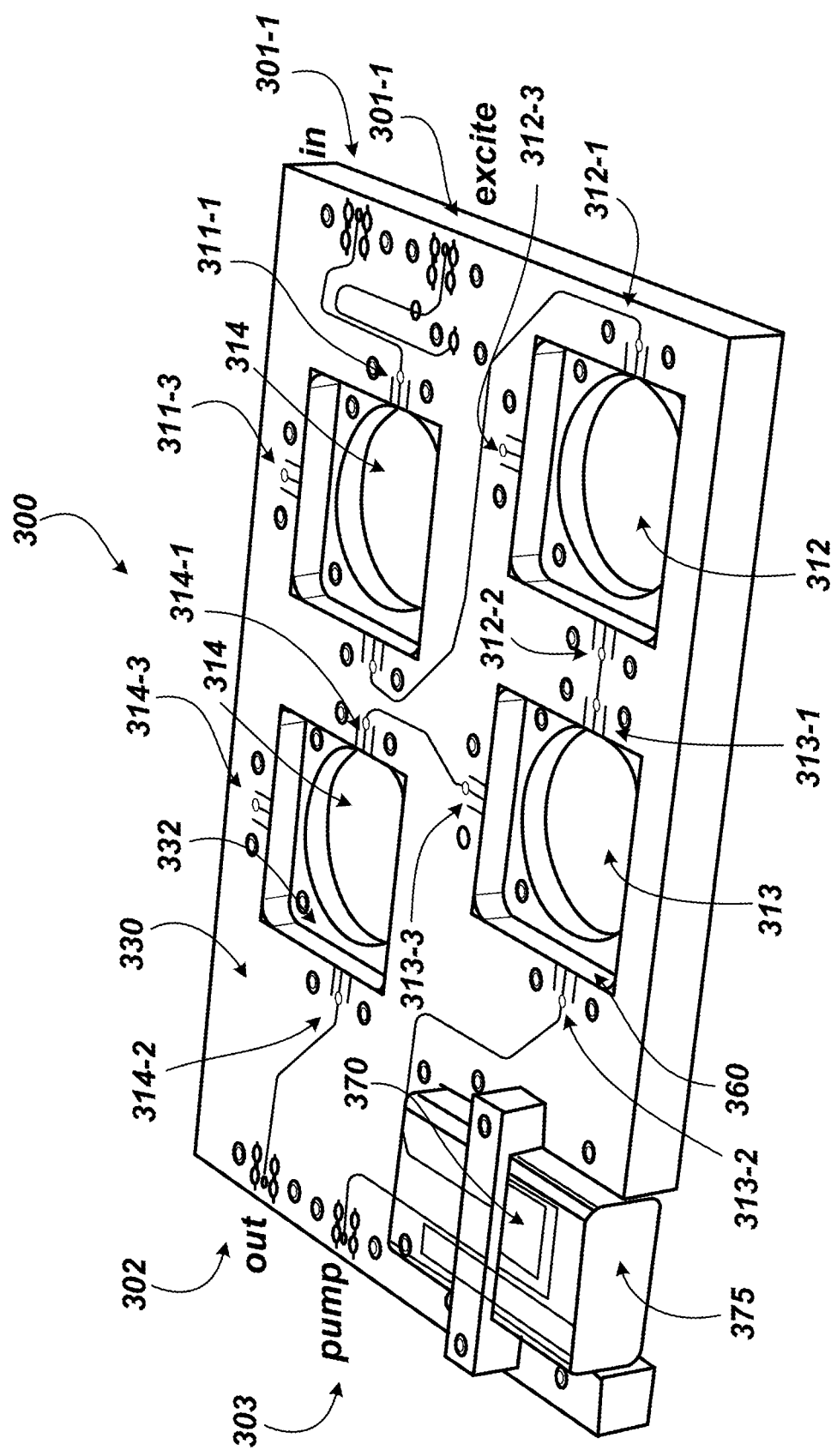

FIG. 3b is a schematic that illustrates an exemplary integrated circuit board for qubit readout circuit with references to FIGS. 1 and 2. In particular, FIG. 3b shows a mechanical drawing of the integrated circuit board 300 when sunken holes are formed to mount the circulators 110, 210, 111, 211, 112, 212, 113, 114, 214.

FIG. 3b shows that each of the sites 311, 312, 313, 314 is sunken such that part of a front plane layer 330 is lowered to form a thermal contact area 332. As discussed above, most of the thermal contact area 332 may not be visible from the top once the circulators 110, 210, 111, 211, 112, 212, 113, 114, 214 are mounted. Also as discussed above, the thermal contact area 332 comprises a conducting layer which is electrically and thermally connected to the back plane layer 350, not shown in FIG. 3b via the ground vias 251, also not shown in FIG. 3b. FIG. 3b also shows that each of the sites 311, 312, 313, 314 includes at the level of the thermal contact area 332 a cylindrical void such that the all of the front plane layer 230, 330, the signal layer 240, the back plane layer 250 and the support layer 260, 360 are removed. The physical extent of such cylindrical voids may be determined such that the thermalization of the circulators 110, 210, 111, 211, 112, 212, 113, 114, 214 are efficiently performed within the sites 311, 312, 313, 314. For example, in order to increase the thermal transfer, the area of the thermal contact area 332 may be increased and the extent of the voids may be decreased.

FIG. 3b shows that the first ports 111-1, 211-1, 112-1, 212-1, 113-1, 114-1, 214-1, the second ports 111-2, 211-2, 112-2, 212-2, 113-2, 114-2, 214-2 and the third ports 111-3, 211-3, 112-3, 212-3, 113-3, 114-3, 214-3 of the circulators 111, 211, 112, 212, 113, 114, 214 are electrically connected as described in FIGS. 1 and 3a.

The lines in FIG. 3b representing the electrical connects may be at the level of the signal layer 240. In some implementations, the signal layer 240 may comprise one or more stripline waveguides. As discussed above, in some implementations, the signal layer 240 and the thermal contact area 332 may be at the same level within the integrated circuit board 300. Also as discussed above, in some implementations, the signal layer 240 may be at a higher level than the thermal contact area 332 to allow for convenient electrical connection via soldering or wire bonding.

The design of the integrated circuit board 300 shown in FIG. 3b allows for independent clamping of circuit components on the integrated circuit board 300 while enabling the circuit board 300 to act as a good thermal sink.

In some implementations, the integrated circuit board 300 may further include a magnetic shield tube 375, which is described later in FIG. 3c.

In some implementations, SMA connectors may be clamped to the input terminal 301-1, the excite terminal 301-2, the output terminal 302, and the pump terminal 303 of the integrated circuit board 300 such that a sufficient amount of torque can be applied in fastening the SMA connectors without damaging the board. The four holes around each terminal 301-1, 301-2, 302, 303 are for mounting the SMA connectors with four pins for alignment and grounding.

In some implementations, SMA connectors may be clamped to the input port 301, output port 302, and the pump port 303 of the integrated circuit board 300 such that a sufficient amount of torque can be applied in fastening the SMA connectors without damaging the board. FIG. 3c is a schematic that illustrates a portion of an exemplary integrated circuit board for a qubit readout circuit. In particular, FIG. 3c shows a schematic of the magnetic shield tube 375 and the configuration of the integrated circuit board 300 around the site for the Josephson junction parametric amplifier 370.

The circulators 110, 210, 111, 211, 112, 212, 113, 114, 214 may comprise magnetized ferrite materials and the Josephson junction parametric amplifier 130 may be sensitive to the magnetic field since the operation of the Josephson junction is dependent on the magnetic flux bias applied on it. Therefore, in order to integrate the circulators 110, 210, 111, 211, 112, 212, 113, 114, 214 and the Josephson junction parametric amplifier 130 in a close proximity within one integrated circuit board 300, the Josephson junction parametric amplifier 130 should be shielded from the magnetic field generated by the circulators 110, 210, 111, 211, 112, 212, 113, 114, 214 to a degree that it does not affect the operation of the Josephson junction parametric amplifier 130.

Figure 3C:
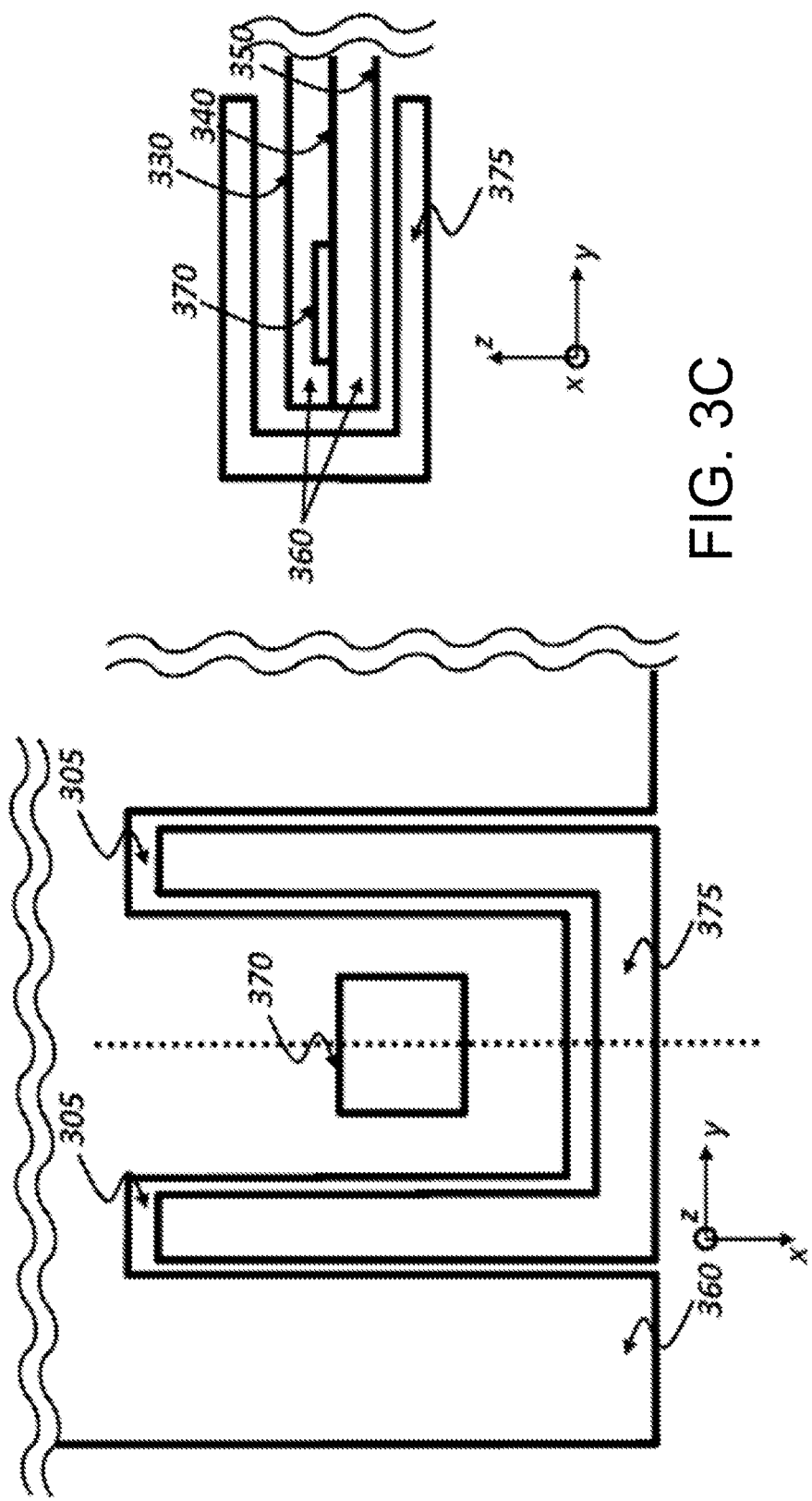

FIG. 3c shows in the left panel the magnetic shield tube 375 when it is slotted in a slot 305 formed within the integrated circuit board. The material for the magnetic shield tube 375 comprises a mu-metal, which is an alloy with a high magnetic permeability, often used for magnetic shielding. The example of the material for the magnetic shield includes Amuneal 4K.

In some implementations, the magnetic shield tube 375 may be a separate component from the integrated circuit board 300 and to be assembled by slotting into the slot 305 formed within the integrated circuit board 300, as shown in the left panel of FIG. 3c.

The magnetic shield tube 375 may comprise a mu metal shaped in the form of a cylinder with at least one of the faces open such that it can be slotted in to the slot 305 formed on at least one of the side surfaces of the integrated circuit board 300.

It is known that for effective magnetic shielding, the aspect ratio is one of the crucial parameters. In other words, the ratio between the length of the magnetic shield tube 375 along the x-axis in FIG. 3c, and the lateral extent of the cross section of the magnetic shield tube 375, along the y-axis in FIG. 3c determines the degree of magnetic shielding. Therefore, if the thickness of the integrated circuit board 300, along the z-axis in FIG. 3c, is kept small, the volume occupied by the magnetic shield tube 375 can be correspondingly small while maintaining the aspect ratio of the magnetic shield tube 375. Since the thickness of the integrated circuit board 300 in the z-direction, may be determined by the depth of the sunken holes to mount the circulators 110, 210, 111, 211, 112, 212, 113, 114, 214 or the termination resistors 120, 220, 121, 221, 122, 222, 123, 124, 224, if the extent of the circulators 110, 210, 111, 211, 112, 212, 113, 114, 214 or the termination resistors 120, 220, 121, 221, 122, 222, 123, 124, 224 in the z-direction, is kept small to keep a low-profile, the volume of the magnetic shield tube 375 can be decreased.

In some implementations, the slot 305 may be formed from one of the sides, for example in the y-z plane of FIG. 3c, of the integrated circuit board 300 near the site for the Josephson junction parametric amplifier 370. The slot 305 includes at least two elongated channels within which the walls of the cylinder formed by the magnetic shield tube 375 fit in.

In some implementations, the slot 305 may further include a recession along the side of the integrated circuit board in which the blocked end of the cylinder formed by the magnetic shield tube 375 is disposed such that it is flush with the side surface of the integrated circuit board 300.

The right panel of FIG. 3c shows the cross section of the assembly of the integrated circuit board 300 and the magnetic shield tube 375 along the dotted line in the left panel of FIG. 3c.

In some implementation, the extent of the interior of the cylinder formed by the magnetic shield tube 375, along the z-axis in FIG. 3c, may be arranged to fit or to be larger than the thickness of the integrated circuit board 300. In this case, the magnetic shield tube 375 encloses, on one edge of the integrated circuit board 300 around the site for the Josephson parametric amplifier 370, the front plane layer 330, the signal layer 340, and the back plane layer 350 around the site for the Josephson parametric amplifier 370.

Alternatively, in some implementations, the slots 305 may be further formed such that the magnetic shield tube 375 encloses only the signal layer 340 and the site for the Josephson parametric amplifier 370, or such that the magnetic shield tube 375 encloses only the front plane layer 330, the signal layer 340 and the site for the Josephson parametric amplifier 370, or such that the magnetic shield tube 375 encloses only the signal layer 340, the site for the Josephson parametric amplifier 370 and the back plane layer 370. As long as the aspect ratio of the magnetic shield tube 375 is maintained at a level where the necessary magnetic shielding is obtained, the slot 305 around the site for the Josephson parametric amplifier 370 may be arranged accordingly.

Compared to the case where magnetic shielding is achieved by the casings of the circulators 110, 210, 111, 211, 112, 212, 113, 114, 214 comprising a mu-metal, the implementations described above and shown in FIGS. 3b and 3c are more compact and also more effective for thermalization because only the site for the Josephson parametric amplifier 370 is magnetically shielded and because the material for the casings of the circulators 110, 210, 111, 211, 112, 212, 113, 114, 214 can be chosen to optimize thermalization rather than requiring magnetic shielding. As such, the circulators 110, 210, 111, 211, 112, 212, 113, 114, 214 can be disposed close to the Josephson parametric amplifier 370, providing a more compact design of the integrated circuit board 300. Furthermore, the tube-shape of the magnetic shield tube 375 and the fact that it is a separate component from the integrated circuit board 300 provide more freedom in routing the electrical connections into and out of the site for the Josephson parametric amplifier 370 compared to the case where the magnetic shielding is built into the integrated circuit board 300.

Figure 4:
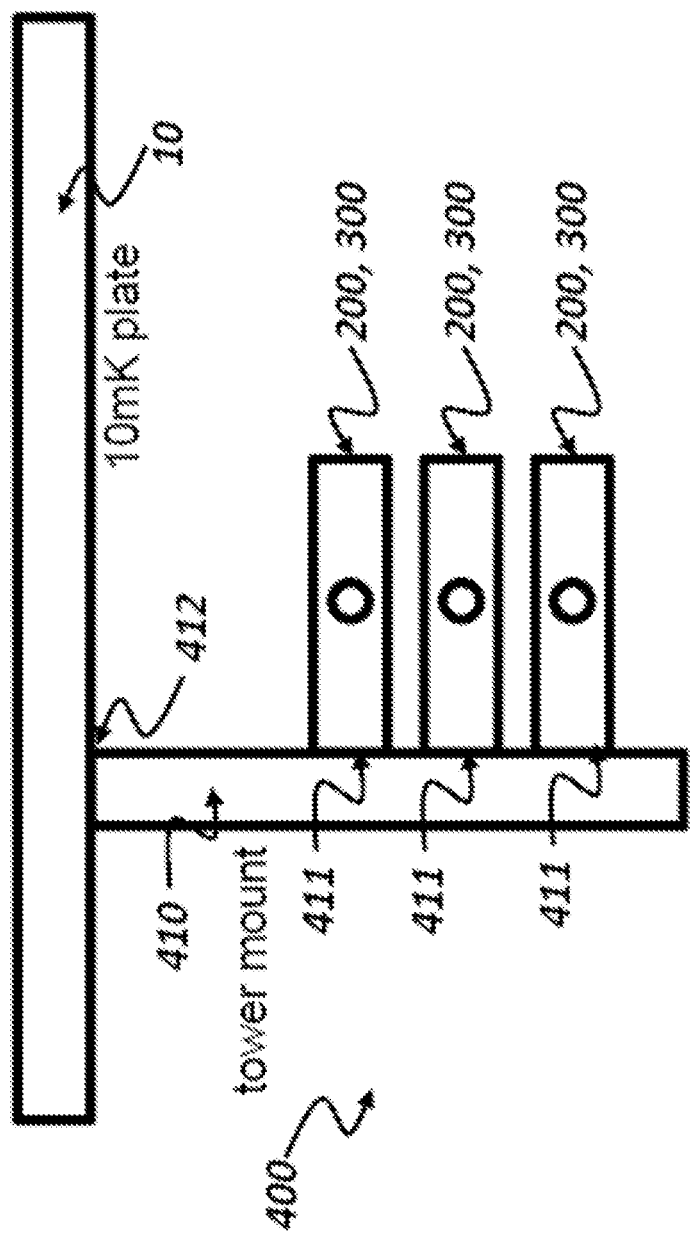
FIG. 4 is a schematic that illustrates an exemplary qubit readout assembly.

FIG. 4 is a schematic that illustrates an exemplary qubit readout assembly with references to FIGS. 1 to 3.

The qubit readout assembly 400 includes an expansion board 410. The expansion board 410 is configured to receive one or more the integrated circuit boards or cards 200, 300 described above in FIGS. 2 and 3 in a stacked configuration. The integrated circuit boards 200, 300 may further include the circulators 110, 210, 111, 211, 112, 212, 113, 114, 214 or the termination resistors 120, 220, 121, 221, 122, 222, 123, 124, 224 mounted on the integrated circuit boards 200, 300 such that each of the integrated circuit boards 200, 300 form a qubit readout circuit 100 described above in FIG. 1.

Each of the integrated circuit boards 200, 300 configured to form the qubit readout circuit 100 may serve as a pre-amplifying stage for a single channel which includes a plurality of qubits coupled to a single readout transmission line via respective readout resonators. In case a plurality of channels of qubits are used for computation, a corresponding number of the integrated circuit boards 200, 300 configured to form the qubit readout circuit 100 may be used.

Since each of the integrated circuit boards 200, 300 configured to form the qubit readout circuit 100 is provided in a shape of a planar board with low-profile components mounted on it, the expansion board may further comprise a plurality of sockets 411 arranged to receive the plurality of the integrated circuit boards 200, 300 configured to form the qubit readout circuit 100 such that they are mounted on the expansion board 410 largely parallel to one another. In particular, the plurality of sockets 411 may be formed such that the front plane layer 230, 330 and the back plane layer 250, 350 are with a large surface contact with the body of the expansion board 410.

The expansion board 410 further includes a connector 412 which allows connection of the expansion board 410 with a cold finger 10 of the cryostat with a large surface contact. In case the cryostat is a dilution refrigerator, the cold finger 10 may be the mixing plate of the dilution refrigerator which provides around 10 mK temperature.

It is crucial that the plurality of sockets 411 and the connector 412 are arranged to allow an efficient thermal transfer between two parts joined by the plurality of sockets 411 and the connector 412.

The expansion board 410 may comprise a material with a good thermal conductivity at a cryogenic temperature, such as copper. The expansion board 410 may have a large enough volume and correspondingly a large enough thermal capacity such that the temperature does not rise locally at a certain position within the expansion board due to the heat received via the plurality of sockets 411 and such that the heat received is transferred to the cold finger 10 of the cryostat efficiently.

The shape and the types of the plurality of sockets 411 and the connector 412 may be determined such that when the dilution refrigerator is in operation and the temperature of the cold finger 10 is at its base temperature, the plurality of the integrated circuit boards 200, 300 attached to the expansion board 410 are at a thermal equilibrium with the cold finger 10 and at a temperature largely equal to the temperature of the cold finger 10.

In some implementations, the expansion board 410 may include electrical connections connected to the input port 301, the output port 302, and the pump port 303 of each of the integrated circuit boards 200, 300 configured to form the qubit readout circuit 100. For example, a qubit chip containing the plurality of channels of qubits may be mounted on the cold finger 10, which is the mixing plate of the dilution refrigerator and a HEMT (High Electron Mobility Transistor) amplifier may be mounted on a 3K stage of the dilution refrigerator. The expansion board 410 may be arranged such that it contains or mechanically supports the electrical connections from the qubit chip to the input port 301 and the electrical connections from the output port 302 to the HEMT amplifier.

In some implementations, the expansion board 410 may form a tower mount to which the integrated circuit boards 200, 300 are mounted. The expansion board 410 and the integrated circuit boards 200, 300 may provide a highly modular system such that broken electrical lines can be easily repaired and the circuit components mounted on the integrated circuit boards can be replaced and/or reconfigured.

Using the design of the integrated circuit boards 200, 300 shown in FIGS. 2 and 3 and the expansion board shown in FIG. 4, the readout lines may be constructed at a fraction of the size of an existing readout line. For example, 30 readout lines may fit within the experimental space near the mixing plate of a dilution refrigerator.

Implementations of the quantum subject matter and quantum operations described in this specification can be implemented in suitable quantum circuitry or, more generally, quantum computational systems, also referred to as quantum information processing systems, including the structures disclosed in this specification and their structural equivalents, or in combinations of one or more of them. The terms "quantum computational systems" and "quantum information processing systems" may include, but are not limited to, quantum computers, quantum cryptography systems, topological quantum computers, or quantum simulators.

The terms "quantum information" and "quantum data" refer to information or data that is carried by, held or stored in quantum systems, where the smallest non-trivial system is a qubit, e.g., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In some implementations the computational basis states are identified with the ground and first excited states, however it is understood that other setups where the computational states are identified with higher level excited states are possible. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Quantum circuit elements (also referred to as quantum computing circuit elements) include circuit elements for performing quantum processing operations. That is, the quantum circuit elements are configured to make use of quantum-mechanical phenomena, such as superposition and entanglement, to perform operations on data in a non-deterministic manner. Certain quantum circuit elements, such as qubits, can be configured to represent and operate on information in more than one state simultaneously. Examples of superconducting quantum circuit elements include circuit elements such as quantum LC oscillators, qubits (e.g., flux qubits, phase qubits, or charge qubits), and superconducting quantum interference devices (SQUIDs) (e.g., RF-SQUID or DC-SQUID), among others.

In contrast, classical circuit elements generally process data in a deterministic manner. Classical circuit elements can be configured to collectively carry out instructions of a computer program by performing basic arithmetical, logical, and/or input/output operations on data, in which the data is represented in analog or digital form. In some implementations, classical circuit elements can be used to transmit data to and/or receive data from the quantum circuit elements through electrical or electromagnetic connections. Examples of classical circuit elements include circuit elements based on CMOS circuitry, rapid single flux quantum (RSFQ) devices, reciprocal quantum logic (RQL) devices and ERSFQ devices, which are an energy-efficient version of RSFQ that does not use bias resistors.

Fabrication of the quantum circuit elements and classical circuit elements described herein can entail the deposition of one or more materials, such as superconductors, dielectrics and/or metals. Depending on the selected material, these materials can be deposited using deposition processes such as chemical vapor deposition, physical vapor deposition (e.g., evaporation or sputtering), or epitaxial techniques, among other deposition processes. Processes for fabricating circuit elements described herein can entail the removal of one or more materials from a device during fabrication. Depending on the material to be removed, the removal process can include, e.g., wet etching techniques, dry etching techniques, or lift-off processes. The materials forming the circuit elements described herein can be patterned using known lithographic techniques (e.g., photolithography or e-beam lithography).

During operation of a quantum computational system that uses superconducting quantum circuit elements and/or superconducting classical circuit elements, such as the circuit elements described herein, the superconducting circuit elements are cooled down within a cryostat to temperatures that allow a superconductor material to exhibit superconducting properties. A superconductor (alternatively superconducting) material can be understood as material that exhibits superconducting properties at or below a superconducting critical temperature. Examples of superconducting material include aluminum (superconductive critical temperature of about 1.2 kelvin), indium (superconducting critical temperature of about 3.4 kelvin), NbTi (superconducting critical temperature of about 10 kelvin) and niobium (superconducting critical temperature of about 9.3 kelvin). Accordingly, superconducting structures, such as superconducting traces and superconducting ground planes, are formed from material that exhibits superconducting properties at or below a superconducting critical temperature.

While this specification contains many specific implementation details, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. For example, the actions recited in the claims can be performed in a different order and still achieve desirable results. In certain circumstances, multitasking and parallel processing may be advantageous. Moreover, the separation of various components in the implementations described above should not be understood as requiring such separation in all implementations.

A number of embodiments have been described. Nevertheless, it will be understood that various modifications may be made without departing from the spirit and scope of the invention. Accordingly, other embodiments are within the scope of the following claims.

The invention claimed is:

1. An integrated qubit readout circuit comprising:
a superconducting parametric amplifier;
a circuit board arranged to mount the superconducting parametric amplifier; and
a circulator mounted on the circuit board and connected to the superconducting parametric amplifier,
wherein the circulator comprises a termination port electrically connected to a termination resistor arranged to terminate a pump tone received by the superconducting parametric amplifier, and
wherein the termination resistor is mounted on the circuit board.

2. An integrated qubit readout circuit of claim 1,
wherein at least part of an external surface of the termination resistor is in direct contact with the circuit board.

3. An integrated qubit readout circuit of claim 1,
wherein at least part of an external surface of the circulator is in direct contact with the circuit board.

4. An integrated qubit readout circuit of claim 3,
wherein the circuit board comprises a front plane layer, a signal layer, a back plane layer, and a support layer,
wherein the front plane layer is disposed on a first side of the support layer and the back plane layer is disposed on a second side of the support layer that is opposite to the first side,
wherein the signal layer is disposed between the front plane layer and the back plane layer within the support layer, and
wherein the circulator and the termination resistor are mounted on the first side of the support layer such that at least one surface of the circulator and the termination resistor is in direct contact with the front plane layer.

5. An integrated qubit readout circuit of claim 4,
wherein the superconducting parametric amplifier is mounted on the signal layer.

6. An integrated readout circuit of claim 5,
wherein the front plane layer, the signal layer and the back plane layer comprise a conductor whose thermal conductivity is larger than 300 W/m/K at 10 mK temperature, and wherein the circulator and the termination resistor are mounted on the front plane layer.

7. An integrated qubit readout circuit of claim 6,
wherein the support layer comprises a first via arranged to electrically and thermally connect a first part of the front plane layer in contact with the at least part of an external surface of the circulator to the back plane layer, and
wherein the support layer comprises a second via arranged to electrically connect a second part of the front plane layer to the signal layer.

8. An integrated qubit readout circuit of claim 6,
wherein the front plane layer comprises aluminum and the back plane layer comprises copper.

9. An integrated qubit readout circuit of claim 5,
wherein the signal layer comprises a strip line waveguide.

10. An integrated qubit readout circuit of claim 9,
wherein the signal layer comprises a directional coupler formed with the strip line waveguide.

11. An integrated qubit readout circuit of claim 4,
wherein the back plane layer is connectable to a heat sink.

12. An integrated qubit readout circuit of claim 3,
wherein the at least part of the external surface of the circulator in direct contact with the circuit board comprises a material whose thermal conductivity is larger than 300 W/m/K at 10 mK temperature.

13. An integrated qubit readout circuit of claim 12, further comprising:
a magnetic shield disposed around the superconducting parametric amplifier, arranged to shield the superconducting parametric amplifier from magnetic fields of the circulator.

14. An integrated qubit readout circuit of claim 13,
wherein the magnetic shield comprises a tube-shaped body comprising a mu-metal arranged to enclose the superconducting parametric amplifier when the magnetic shield is mounted on the circuit board.

15. An integrated qubit readout circuit of claim 14,
wherein the circuit board comprises a first slot arranged on a first side of the superconducting parametric amplifier and a second slot arranged on a second side of the superconducting parametric amplifier,
wherein the first slot and the second slot are dimensioned so as to receive the magnetic shield, and
wherein a distance between the first slot and the second slot matches a diameter of the magnetic shield.

16. An integrated qubit readout circuit of claim 1,
wherein the circulator comprises a passive ferrite circulator.

17. An integrated qubit readout circuit of claim 1,
wherein the termination resistor comprises a 50 Ohm resistor.

18. A qubit readout assembly comprising:
an expansion board connectable to a cold finger of a cryostat;
a plurality of the integrated qubit readout circuits of claim 1,
wherein the expansion board is configured to receive the plurality of the integrated qubit readout circuits such that the plurality of the integrated qubit readout circuits are mounted on the expansion board,
wherein the expansion board is configured such that the expansion board and the plurality of the integrated qubit readout circuits are in a thermal equilibrium with the cold finger of the cryostat when the expansion board is connected to the cold finger and the plurality of the integrated qubit readout circuits are mounted on the expansion board, and
wherein the expansion board is configured to provide electrical connections between a circuit in contact with the cold finger and the plurality of the integrated qubit readout circuits.

* * * * *